United States Patent
Abel et al.

(10) Patent No.: US 8,514,920 B2
(45) Date of Patent: *Aug. 20, 2013

(54) METHODS AND APPARATUS FOR PSEUDO ASYNCHRONOUS TESTING OF RECEIVE PATH IN SERIALIZER/DESERIALIZER DEVICES

(75) Inventors: Christopher J. Abel, Coplay, PA (US); Parag Parikh, Allentown, PA (US); Vladimir Sindalovsky, Perkasie, PA (US)

(73) Assignee: LSI Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/558,794

(22) Filed: Jul. 26, 2012

(65) Prior Publication Data

US 2012/0287983 A1 Nov. 15, 2012

Related U.S. Application Data

(63) Continuation of application No. 12/394,286, filed on Feb. 27, 2009, now Pat. No. 8,275,025.

(51) Int. Cl.
*H04B 17/00* (2006.01)

(52) U.S. Cl.
USPC ........... 375/224; 375/219; 375/220; 375/221; 375/222; 375/226; 375/295; 375/316; 375/354; 375/370; 375/371; 375/373; 375/375; 375/376; 455/73; 455/91; 455/130; 455/260; 455/502; 455/516; 370/272; 370/273; 370/276; 370/297; 370/503; 370/508; 370/509; 370/510; 370/511; 370/512; 370/513; 370/514; 327/141; 327/147; 327/156; 329/360; 329/361; 341/122; 714/707; 379/27.01

(58) Field of Classification Search
USPC ................. 375/219, 220, 221, 222, 224, 226, 375/295, 316, 354, 370, 371, 373, 375, 376; 455/73, 91, 130, 260, 502, 516; 370/272, 370/273, 276, 297, 503, 508–514; 327/141, 327/147, 156; 329/360, 361; 341/122; 714/707; 379/27.01
See application file for complete search history.

(56) References Cited

U.S. PATENT DOCUMENTS

| | | | |
|---|---|---|---|
| 7,099,424 B1 | 8/2006 | Chang et al. | 375/370 |
| 7,246,018 B1 | 7/2007 | Lo et al. | 702/72 |
| 7,251,765 B2 | 7/2007 | Kushiyama et al. | 714/733 |
| 7,363,563 B1 | 4/2008 | Hissen et al. | 714/733 |
| 7,848,394 B2 | 12/2010 | Clancy et al. | 375/219 |
| 7,860,472 B2 | 12/2010 | Nedachi | 455/226.1 |
| 2007/0014342 A1 | 1/2007 | Sindalovsky et al. | 375/224 |

*Primary Examiner* — Leon Flores
(74) *Attorney, Agent, or Firm* — Ryan, Mason & Lewis, LLP

(57) ABSTRACT

Methods and apparatus are provided for pseudo asynchronous testing of receive paths in serializer/deserializer (SerDes) devices. A SerDes device is tested by applying a source of serial data to a receive path of the SerDes device during a test mode. The receive path substantially aligns to incoming data using a bit clock. A phase is adjusted during the test mode of the bit clock relative to the source of serial data to evaluate the SerDes device. The source of serial data may be, for example, a reference clock used by a phase locked loop to generate the bit clock. The phase of the bit clock can be directly controlled during the test mode, for example, by a test phase control signal, such as a plurality of interpolation codes that are applied to an interpolator that alters a phase of the bit clock.

12 Claims, 2 Drawing Sheets

METHODS AND APPARATUS FOR PSEUDO ASYNCHRONOUS TESTING OF RECEIVE PATH IN SERIALIZER/DESERIALIZER DEVICES

CROSS-REFERENCE TO RELATED APPLICATIONS

This application is a continuation of U.S. patent application Ser. No. 12/394,286, filed Feb. 27, 2009, incorporated by reference herein.

FIELD OF THE INVENTION

The present invention is related to techniques for testing of serializer/deserializer (SerDes) devices and, more particularly, to techniques for pseudo asynchronous testing of the receive path in SerDes devices.

BACKGROUND OF THE INVENTION

SerDes devices are frequently used in communication networks in which an interface must be provided between parallel bus-connected devices and high-speed serial communication networks. Conventional SerDes devices typically utilize Voltage Controlled Delay Locked Loops (VCDLs) and/or interpolators to lock the frequency and phase of the device to an incoming serial data stream. With current testing techniques, the receive functionality of the SerDes device is not fully tested because the incoming serial data is synchronous to the reference clock utilized in the VCDL. The incoming serial data is typically generated by the SerDes device itself (e.g., in a serial loopback mode) or by an external automated test equipment (ATE) device. In addition, there is no asynchronous clock available for testing using the external test equipment. As a result, conventional techniques test the receive functionality of SerDes devices only for a phase that is locked to the synchronous serial data.

Thus, conventional testing techniques are insufficient. Such synchronous testing does not adequately test SerDes devices, because not all possible delay combinations are tested. The SerDes devices are not tested fully to determine whether the devices accurately lock to asynchronous incoming data, for both frequency and phase.

U.S. patent application Ser. No. 11/181,286, entitled "Pseudo Asynchronous Serializer Deserializer (SerDes) Testing", discloses techniques for testing the receive path of a SerDes device. While the disclosed testing techniques ensure that a SerDes device accurately locks to asynchronous incoming data, for both frequency and phase, they can only be applied to SerDes devices that are based on a VCDL.

Another known technique (discussed further below in conjunction with FIG. 1) aligns the phases of an arbitrary transmit write clock (TWC) and a transmit byte clock (XCK) having the same frequency. When these two clocks TWC, XCK are phase aligned, the transmit (TX) parallel data can be passed directly from the TX data source operating using the TWC clock to the serializer using an internal bit clock and lower frequency derivatives down to the byte rate clock (XCK). This arrangement eliminates the need for a transmit first-in-first-out (FIFO) buffer between the two clock domains and thus reduces serializer latency.

A need therefore exists for improved techniques for asynchronous testing of the receive path of SerDes devices.

SUMMARY OF THE INVENTION

Generally, methods and apparatus are provided for pseudo asynchronous testing of a receive path in serializer/deserializer devices. According to one aspect of the invention, a method is provided for testing a serializer/deserializer device. A source of serial data is applied to a receive path of the serializer/deserializer device during a test mode. The receive path substantially aligns to incoming data using a bit clock. A phase is adjusted during the test mode of the bit clock relative to the source of serial data to evaluate the serializer/deserializer device. The source of serial data may be, for example, a reference clock used by a phase locked loop to generate the bit clock.

The phase of the bit clock can be directly controlled during the test mode, for example, by a test phase control signal. The test phase control signal or a phase control signal can be selectively applied to an interpolator. The phase control signal is generated by a phase detector in a transmit path of the serializer/deserializer device. The test phase control signal can comprise, for example, a plurality of interpolation codes that are applied to an interpolator that alters a phase of the bit clock.

According to another aspect of the invention, the source of serial data or received serial data can be selectively applied to the receive path. The source of serial data generally has a substantially constant phase.

A more complete understanding of the present invention, as well as further features and advantages of the present invention, will be obtained by reference to the following detailed description and drawings.

DETAILED DESCRIPTION

Figure 1:
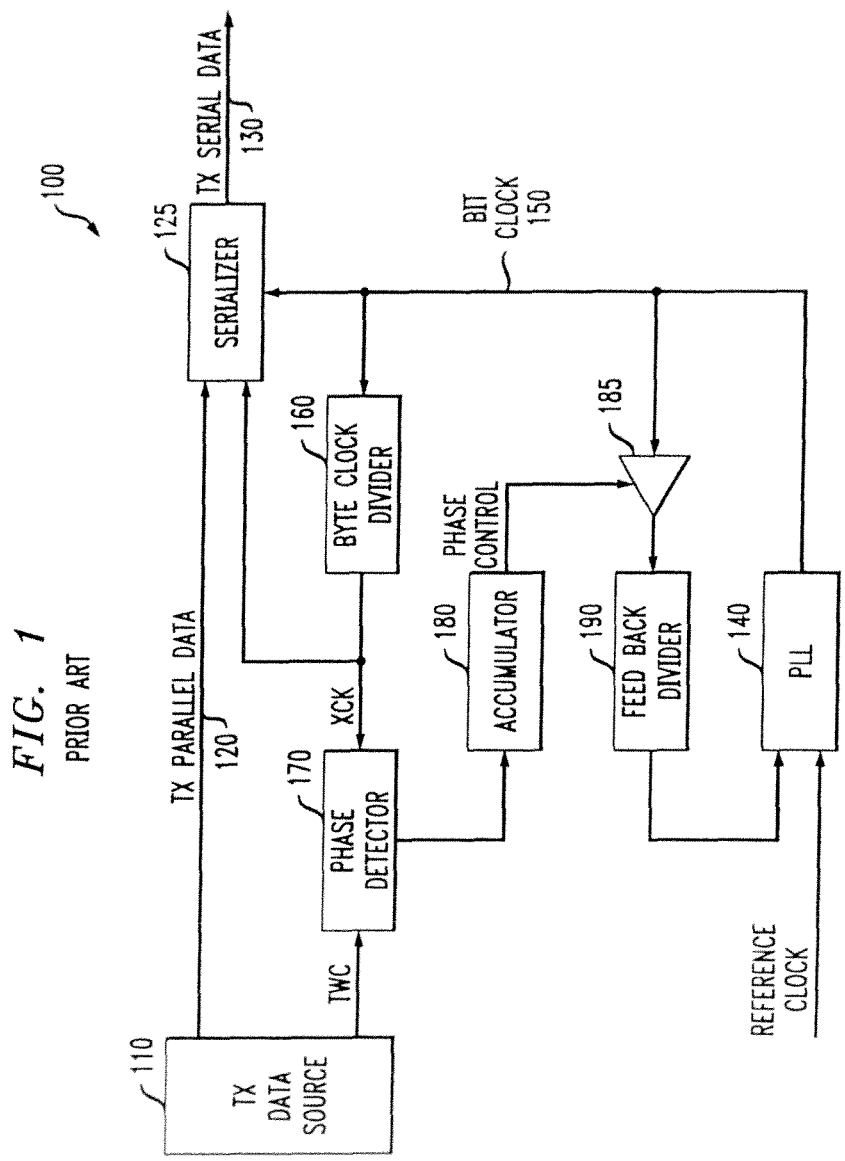
FIG. 1 illustrates a conventional technique for synchronous testing of a SerDes device in a synchronous ATE environment.

The present invention provides pseudo asynchronous testing of the receive path in SerDes devices in a synchronous ATE environment. The SerDes devices may be based, for example, on VCDLs or interpolators. FIG. 1 illustrates a conventional technique for synchronous testing of a SerDes device 100 in a synchronous ATE environment. As shown in FIG. 1, the SerDes device 100 includes a transmit path (TX) that converts parallel data 120 from a data source 110 into serial data 130 using a serializer 125. A PLL 140 generates a high speed clock (bit clock) 150 based on a reference clock. The bit clock 150 is divided down by a byte clock divider 160 to generate a transmit byte clock (XCK) at the byte rate. In addition, the bit clock 150 and byte rate clock XCK are provided to the serializer 125 in order to facilitate serialization of data bits for each period of the byte clock. The data source 110 also provides a transmit write clock (TWC) which launches parallel data 120 with constant phase relation. The TWC can alternatively be generated independently using the same PLL that generates the bit clock 150, or using another PLL (not shown). The XCK and TWC potentially have a phase skew that also varies over process, voltage and temperature (PVT).

A phase detector 170 compares the phase of the transmit write clock and the transmit byte clock. The phase detector 170 indicates a phase offset or skew between the transmit write clock and the transmit byte clock and is applied to an accumulator 180 that generates a phase control signal, in a known manner. The phase control signal can optionally be processed by a noise-shaped filter, such as a sigma-delta filter.

The phase control signal is applied to an interpolator 185 in the feedback loop 190 of the PLL 140. The feedback loop 190 influences a phase shift such that the phase relation between the reference clock and the output of the feedback divider 190 is close to zero. In this manner, the PLL 140 locks onto the phase of the reference clock. Further, such an arrangement provides for the phases of XCK and TWC to be aligned so that the TX Parallel Data 120 can be passed directly (without increasing data path latency) from the TX Data Source 110 to the serializer 125.

Generally, the same bit clock 150 that is used for the serializer 125, is also used in receive-path CDR, if the latter is based upon a VCDL or an interpolator for clock and data recovery. In the synchronous ATE environment of FIG. 1, external serial data with a constant phase relation to the bit clock 150 (loop back serial data from the transmitter) is used for receiver (RX) CDR testing. The present invention recognizes, however, that the synchronous and constant phase characteristics of this serial RX data does not provide for exhaustive RX CDR testing because the phase adjustment capabilities of CDR are not exercised to the full extent.

According to one aspect of the present invention, a mechanism is provided for asynchronous testing of the receive path in a SerDes device. The pseudo asynchronous testing of the RX CDR is achieved by controlling the phase relation between the reference clock (or any other constant phase clock) and the bit clock.

Figure 2:
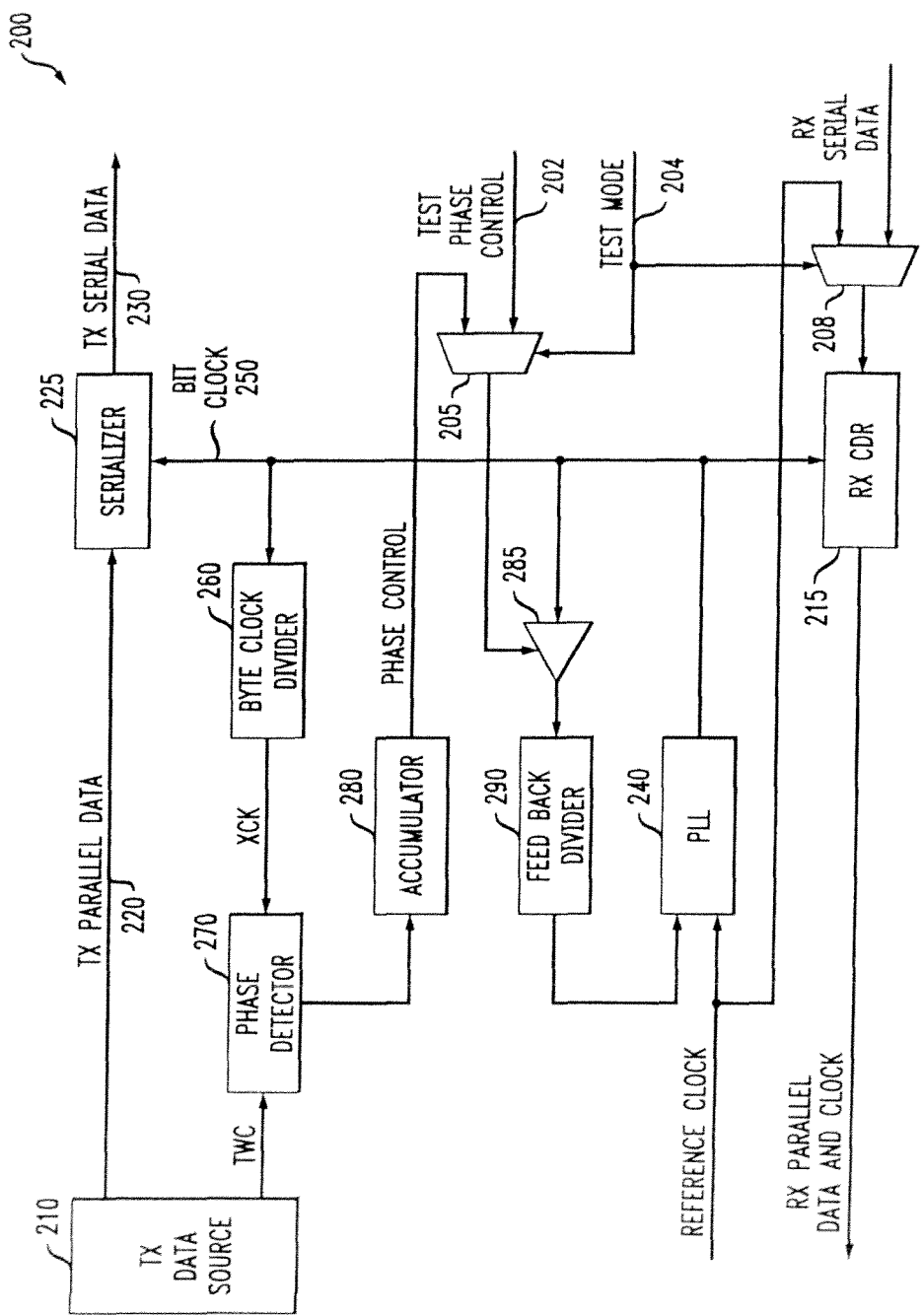
FIG. 2 illustrates pseudo asynchronous testing of a SerDes device in accordance with the present invention.

FIG. 2 illustrates pseudo asynchronous testing of a SerDes device 200 in accordance with the present invention. As shown in FIG. 2, the SerDes device 200 includes a transmit path (TX) that converts parallel data 220 from a data source 210 into serial data 230 using a serializer 225, in a similar manner to FIG. 1. A PLL 240 generates a high speed clock (bit clock) 250 based on a reference clock. The bit clock 250 is divided down by a byte clock divider 260 to generate a transmit byte clock (XCK) at the byte rate. In addition, the bit clock 250 and transmit byte clock XCK are provided to the serializer 225 in order to facilitate generation of data bits for each period of the byte clock in order to produce serial data. The data source 210 also provides a transmit write clock TWC that launches the parallel data 220 with a constant phase relation. The generated byte clock XCK and TWC clock have a phase skew that also varies over process, voltage and temperature (PVT).

A phase detector 270 compares the phase of the transmit write clock and the transmit byte clock. The phase detector 270 indicates a phase offset or skew between the transmit write clock and the transmit byte clock and is accumulated by an accumulator 280 that generates a phase control signal, in a known manner. The phase control signal can optionally be processed by a noise-shaped filter, such as a sigma-delta filter. The phase control signal is applied to an interpolator 285 in the feedback loop 290 of the PLL 240. The feedback loop 290 influences a phase shift such that the phase relation between the reference clock and the output of the feedback divider 290 is close to zero. In this manner, the PLL 240 locks onto the phase of the reference clock. Further, such an arrangement provides for the phases of XCK and TWC to be aligned so that the TX Parallel Data 220 can be passed directly (without increasing data path latency) from the TX Data Source 210 to the serializer 225. As shown in FIG. 2, the bit clock 250 is also used as the clock source for the RX CDR 215.

As previously indicated, the present invention provides pseudo asynchronous testing of the RX CDR by controlling the phase relation between the reference clock (or another constant phase clock) and the bit clock. As shown in FIG. 2, the SerDes device 200 in accordance with the present invention includes a multiplexer 205 for selecting between the phase control signal from the accumulator 280 in a normal operating mode or a test phase control signal 202 in a test mode. The multiplexer 205 selects an input based on a test mode signal 204. The test mode signal 204 also controls a second multiplexer 208 that selects between the reference clock (or another constant phase source) in the test mode and the RX serial data in a normal operating mode.

In this manner, the reference clock can be used as a source of serial data for the RX CDR 215 in the test mode. In the test mode, the test phase control signal 202 is applied to the interpolator 285 in order to change the applied interpolation codes. Thus, the present invention provides a direct control of the phase of the bit clock from the test source. The phase relation between the bit clock 250 and the reference clock is varied while the reference clock is used as serial data in the RX CDR 215. In other words, the test phase control signal 202 changes the phase of the bit clock generated by the PLL 240, relative to the reference clock during the test mode.

The RX CDR 215 adjusts during the test mode while seeing different phase relations between the bit clock 250 and the reference clock. Thus, by controlling the phase of the bit clock 250 relative to the constant phase source (e.g., the reference clock), different RX CDR states are exercised, and the recovered parallel data should stay the same for different Test Phase Control states.

In this manner, the pseudo asynchronous testing of RX CDR in SerDes in synchronous ATE environment in accordance with the present invention allows for more complete testing of the RX CDR circuitry.

Conclusion

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

We claim:

1. A method for testing a serializer/deserializer device, comprising:

applying a source of serial data to a data input of a receive path of said serializer/deserializer device during a test mode of said serializer/deserializer device, wherein said source of serial data has a substantially constant phase and wherein said receive path substantially aligns to incoming data using a bit clock, wherein said receive path comprises said data input and a clock input; and adjusting a phase during said test mode of said bit clock relative to said source of serial data for asynchronous testing of said receive path.

2. The method of claim 1, wherein said source of serial data is a reference clock used by a phase locked loop to generate said bit clock.

3. The method of claim 1, wherein said phase of said bit clock is directly controlled during said test mode.

4. The method of claim 1, wherein said phase of said bit clock is controlled during said test mode by a test phase control signal.

5. The method of claim 4, wherein said test phase control signal comprises a plurality of interpolation codes applied to an interpolator that alters a phase of said bit clock.

6. The method of claim 1, further comprising the step of selectively applying said source of serial data or received serial data to said receive path.

7. A serializer/deserializer device, comprising:

a data input of a receive path for processing a source of serial data during a test mode of said serializer/deserializer device, wherein said source of serial data has a substantially constant phase and wherein said receive path substantially aligns to incoming data using a bit clock, wherein said receive path comprises said data input and a clock input, wherein said receive path comprises said data input and a clock input; and an interpolator for adjusting a phase during said test mode of said bit clock relative to said source of serial data for asynchronous testing of said receive path.

8. The serializer/deserializer of claim 7. wherein said source of serial data is a reference clock used by a phase locked loop to generate said bit clock.

9. The serializer/deserializer of claim 7, wherein said phase of said bit clock is directly controlled during said test mode.

10. The serializer/deserializer of claim 7, wherein said phase of said bit clock is controlled during said test mode by a test phase control signal.

11. The serializer/deserializer of claim 10, wherein said test phase control signal comprises a plurality of interpolation codes applied to said interpolator.

12. The serializer/deserializer of claim 7, further comprising a multiplexer that selectively applies said source of serial data or received serial data to said receive path.

* * * * *